(12) United States Patent  (10) Patent No.: US 7,723,182 B2
Jang et al.  (45) Date of Patent: May 25, 2010

(54) STORAGE ELECTRODE OF A CAPACITOR AND A METHOD OF FORMING THE SAME

(75) Inventors: Won-Jun Jang, Seoul (KR); In-Sun Park, Gyeonggi-do (KR); Jae-Young Park, Gyeonggi-do (KR); Ki-Vin Im, Gyeonggi-do (KR); Yong-Woo Hyung, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 1047 days.

(21) Appl. No.: 11/291,798

(22) Filed: Nov. 30, 2005

(65) Prior Publication Data

US 2006/0113575 A1    Jun. 1, 2006

(30) Foreign Application Priority Data

Dec. 1, 2004   (KR) .................. 10-2004-0099688

(51) Int. Cl.
*H01L 21/8242*   (2006.01)
(52) U.S. Cl. ................. 438/253; 438/654; 257/E21.649

(58) Field of Classification Search ................. 438/253, 438/256, 654; 257/E21.014, E21.649
See application file for complete search history.

(56) References Cited

U.S. PATENT DOCUMENTS 6,146,967 A    11/2000   Thakur et al.
6,174,769 B1    1/2001   Lou
6,287,965 B1*   9/2001   Kang et al. ................. 438/648

* cited by examiner

*Primary Examiner*—Chandra Chaudhari
(74) *Attorney, Agent, or Firm*—Stanzione & Kim LLP

(57) ABSTRACT

In an embodiment, a storage electrode of a capacitor in a semiconductor device is resistant to inadvertent etching during its manufacturing processes. A method of forming the storage electrode of the capacitor is described. The storage electrode of the capacitor may include a first metal layer electrically connected with a source region of a transistor through a contact plug penetrating an insulating layer on a semiconductor substrate. A polysilicon layer may then be formed on the first metal layer. A second metal layer is formed on the polysilicon layer.

15 Claims, 7 Drawing Sheets

STORAGE ELECTRODE OF A CAPACITOR AND A METHOD OF FORMING THE SAME

CROSS-REFERENCE TO RELATED APPLICATION

This application claims the benefit of Korean Patent Application No. 10-2004-0099688, filed Dec. 1, 2004, the disclosure of which is hereby incorporated herein by reference in its entirety.

BACKGROUND OF THE INVENTION

1. Technical Field

The present invention relates to a semiconductor device and a method of fabricating the same, and more particularly, to a storage electrode of a capacitor of a semiconductor device and a method of forming a storage electrode of a capacitor.

2. Discussion of Related Art

A DRAM device generally includes a cell array composed of cells to store information, and a peripheral circuit to transfer the information to an exterior region. A memory cell of the DRAM device is generally composed of a transistor for a switching function, and a capacitor for storing information. Hence, an important factor in a DRAM semiconductor device is a capacitance of the cell capacitor for storing information. In this respect, providing a capacitor having a maximized capacitance with a small area is important in the fabrication of the DRAM device that has a reduced minimum line width and high integration.

A capacitance of a capacitor is proportional to the permittivity of its dielectric layer and the area of its electrodes. The capacitor is also inversely proportional to the interval between the capacitor's electrodes. So one way to maximize the capacitance is to increase the areas of the capacitor's electrodes, reduce an interval between the capacitor's electrodes, and use a material layer having a high permittivity for the capacitor's dielectrics.

A bridge may result between storage electrodes (lower electrodes) of different cells due to procedure misalignment and lack of process margins. This problem is a manifestation of a reduced design rule with a highly integrated DRAM device. The bridge may cause twin bit or multi-bit failures. Specifically, the magnitude of the bridge problem in a stack cell structure is inversely proportional to the interval between the storage electrodes (lower electrodes). That is, if the interval is increased, the number of bridges will decrease. But then surface areas of the storage electrodes (lower electrodes) are reduced, and thus, a capacitance of a capacitor is reduced.

Recently, methods proposed to solve the bridge problem include a concave capacitance structure. The concave structure is divided into a box type and a cylinder type.

FIGS. 1 to 4 are cross-sectional views illustrating processes of a conventional method of forming a storage electrode of a concave structure capacitor.

Referring to FIG. 1, an insulating layer 102 is formed on a semiconductor substrate 100 having an isolation layer (not shown) and a transistor (not shown) formed thereon. The insulating layer 102 may be a silicon oxide layer, a silicon oxynitride layer, a phosphosilicate glass (PSG) layer, an undoped silicate glass (USG) layer, a borophosphosilicate glass (BPSG) layer, a plasma enhanced tetraethylothosilicate glass (PE-TEOS) layer, a TEOS layer, or a combination of these layers. Then, a contact plug 104 is formed to penetrate the insulating layer 102 and to contact with a source region (not shown) of the transistor. Then, a lower mold layer 106, an etch stop layer 108, and an upper mold layer 110 are formed on the surface of the resultant structure including the contact plug 104. The upper mold layer 110 is formed of a silicon oxide layer, and is formed of a material layer having a high etch rate in an oxide layer etch recipe, such as for a P-TEOS or SOG group. Then, the upper mold layer 110, the etch stop layer 108, and the lower mold layer 106 are sequentially patterned, forming a storage electrode hole 112 exposing the contact plug 104.

Referring to FIG. 2, a storage electrode layer 116 and a sacrificial layer such as a sacrificial oxide layer 118 are formed on the surface of the resultant structure including the storage electrode hole 112. The storage electrode layer may be a metal layer and a metal nitride layer. The metal layer may be a titanium layer. The metal nitride layer may be a titanium nitride layer. The sacrificial oxide layer 118 may be a silicon oxide layer, a silicon oxynitride layer, a PSG layer, a BSG layer, a BPSG layer, a TEOS layer, a PE-TEOS layer, a spin-on-glass (SOG) layer, a photosensitive layer, or a combination of these layers.

Here, a thin TiSi$_x$ layer (for example, TiSi$_2$ layer) 117 is formed between the storage electrode layer 116 and the contact plug 104 during the formation of the storage electrode layer 116, to increase adhesiveness between the storage electrode layer 116 and the contact plug 104.

Referring to FIG. 3, after the sacrificial oxide layer 118, which buries the storage electrode hole 112, is formed, a node separation process for the storage electrodes is performed. First, the sacrificial oxide layer 118 and the storage electrode layer 116 are planarized and etched until the upper mold layer 110 is exposed, separating a storage electrode 116s into a cell unit. The storage electrode 116s is a cylinder type or a box type, depending on the shape of the storage electrode layer 116. That is, the storage electrode layer 116 fully filling the storage electrode hole 112 forms the storage electrode 116s having a box structure, and the storage electrode layer 116 conformally covering the inner wall of the storage electrode hole 112 forms the storage electrode 116s having a cylinder structure. Then, the sacrificial oxide layer 118 remaining inside the cylinder of the cylinder-structured storage electrode 116s is removed using a wet etch process, to expose the inner wall of the storage electrode 116s.

Referring to FIG. 4, the upper mold layer 110 is isotropically etched, thereby exposing the etch stop layer 108, and concurrently, exposing the outer wall of the storage electrode 116s.

Then, subsequent processes of forming a capacitor are performed such as conformally forming a capacitor dielectric layer 120 on the surface of the resultant structure in which the outer wall of the storage electrode 116s is exposed.

FIGS. 5 to 8 are views illustrating a problem generated in the conventional method of forming a storage electrode of a capacitor.

Referring to FIGS. 5 to 8, the sacrificial oxide layer 118 remaining inside the cylinder of the cylinder-structured storage electrode 116s is removed using a wet etch process. Further, after the storage electrodes 116s are separated into a cell unit, the upper mold layer 110 (FIG. 3) surrounding the storage electrode 116s is removed by an isotropic etching using a wet etch process.

While either the sacrificial oxide layer 118 inside the cylinder of the storage electrode 116s or the upper mold layer 110 is removed using a wet etching, an etch solution may penetrate into the grain boundary of the storage electrode 116s, to reach the TiSi$_x$ layer (for example, TiSi$_2$ layer) 117, and etch the TiSi$_x$ layer (for example, TiSi$_2$ layer) 117.

Further, the etch solution may penetrate into the lower mold layer 106 existing below the etch stop layer 108 through the interface between the storage electrode 116s and the etch stop layer 108, to etch the lower mold layer 106.

Then, the etch solution penetrates into the storage electrode 116s, and there occurs a Galvanic reaction between the storage electrode 116s and the contact plug 104. The contact plug 104 partially corrodes so that cavities are generated. The phenomenon brings snail-shaped defects, which may be so called 'snail defect' by one skilled in the art.

As shown in FIG. 6, a height of the storage electrode 116s is formed relatively high compared to its width, to maximize the capacitance of the capacitor within a limited area. Hence, the lower mold layer 106 functions to support the lower portion of the storage electrode 116s having a high aspect ratio. However, during the removal of the sacrificial oxide layer 118 and the upper mold layer 110, the lower mold layer 106 and the insulating layer 102 may be inadvertently etched by the penetrating etch solution. Then the storage electrode 116s may fall, causing a bridge to occur between neighboring storage electrodes 116s, thereby causing twin bit or multi-bit failures.

Further, the etching of the lower mold layer 106 and the insulating layer 102 during the operation of removing the sacrificial oxide layer 118 and the upper mold layer 110 may cause a lift-up phenomenon, wherein the storage electrode 116s lifts up from the lower mold layer 106 and the insulating layer 102, and the structure of the storage electrode 116s formed through the node separation process may be distorted during an operation of forming a capacitor dielectric layer or an operation of annealing the capacitor dielectric layer. That is, if the lower mold layer 106 and the insulating layer 102 are excessively etched during the operation of removing the sacrificial oxide layer 118 and the upper mold layer 110, the interfaces of the storage electrode 116s, the lower mold layer 106, and the insulating layer 102 may be completely separated, thereby causing a lift-up phenomenon, in which the storage electrode 116s is lifted up. The etch for the lower mold layer 106 and the insulating layer 102 during the operation of removing the sacrificial oxide layer 118 and the upper mold layer 110 is not excessive enough to cause the lift-up phenomenon. Even so, cavities may be generated by the etch of the lower mold layer 106 and the insulating layer 102, causing the structure of the storage electrode of the capacitor to be distorted during subsequent processes of forming a capacitor dielectric layer, or annealing the capacitor dielectric layer.

Further, with the degree of integration of semiconductor memory devices further increased in recent years, unit cell pitches have reduced. Hence, the thickness of the storage electrode 116s becomes even thinner. However, when the storage electrode 116s formed on the sidewall of the storage electrode hole 112 is further reduced in thickness, the etch solution used for removing the sacrificial oxide layer 118 penetrates more easily into the lower mold layer 106 and the insulating layer 102. Thus the problems described above are exacerbated.

FIGS. 7 and 8 are photographs illustrating the storage electrode of the capacitor in which the snail defect phenomenon occurs. FIG. 7 illustrates a leaning hole phenomenon caused by the inclined storage electrode, and FIG. 8 illustrates that cavities are generated in the lower mold layer due to the snail defect phenomenon.

SUMMARY

Therefore, embodiments of the present invention are directed to providing a semiconductor device, and a method of fabricating the same, capable of solving the problems depicted above.

For example, an embodiment of the present invention provides a storage electrode of a capacitor, and a method of forming the same, capable of not falling, despite the storage electrode having a high aspect ratio.

In an embodiment, a storage electrode of a capacitor in a semiconductor device is resistant to inadvertent etching during its manufacturing processes. A method of forming the storage electrode of the capacitor is described. The storage electrode of the capacitor may include a first metal layer electrically connected with a source region of a transistor through a contact plug penetrating an insulating layer on a semiconductor substrate. A polysilicon layer may be formed on the first metal layer. A second metal layer is formed on the polysilicon layer.

Another embodiment of the present invention provides a storage electrode of a capacitor, and a method of forming the same, that avoids an excessive etch of a lower mold layer during its manufacture.

Yet another embodiment of the present invention provides a storage electrode of a capacitor, and a method of forming the same, resistant to the development of a bridge problem.

Still another embodiment of the present invention provides a storage electrode of a capacitor, and a method of forming the same, resistant to a snail defect phenomenon.

Still another embodiment of the present invention provides a storage electrode of a capacitor having an improved concave structure, and a method of forming the same.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

Figure 1:
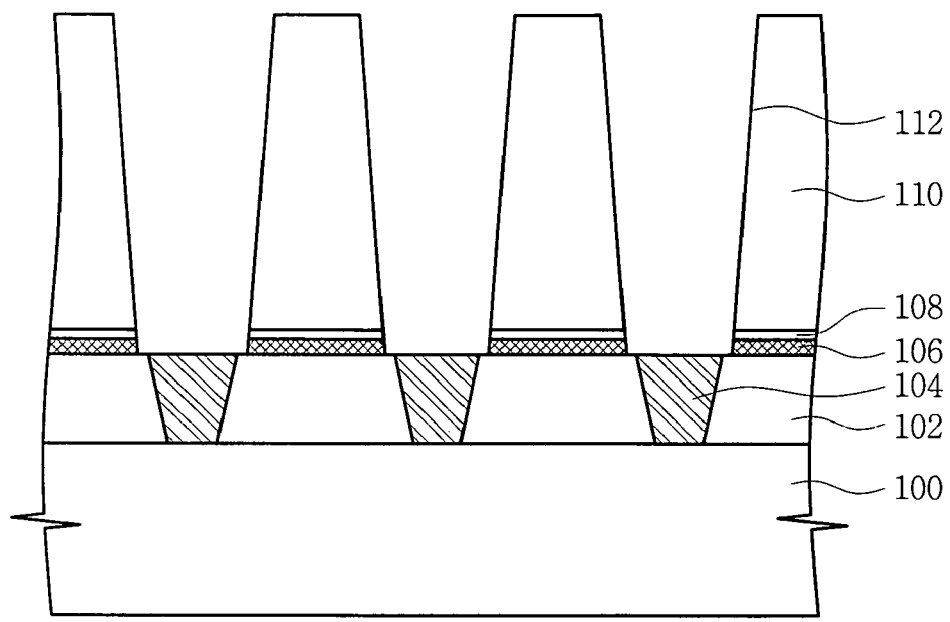
FIGS. 1 to 4 are cross-sectional views illustrating processes of a conventional method of forming a storage electrode of a concave structure capacitor.
Figure 2:
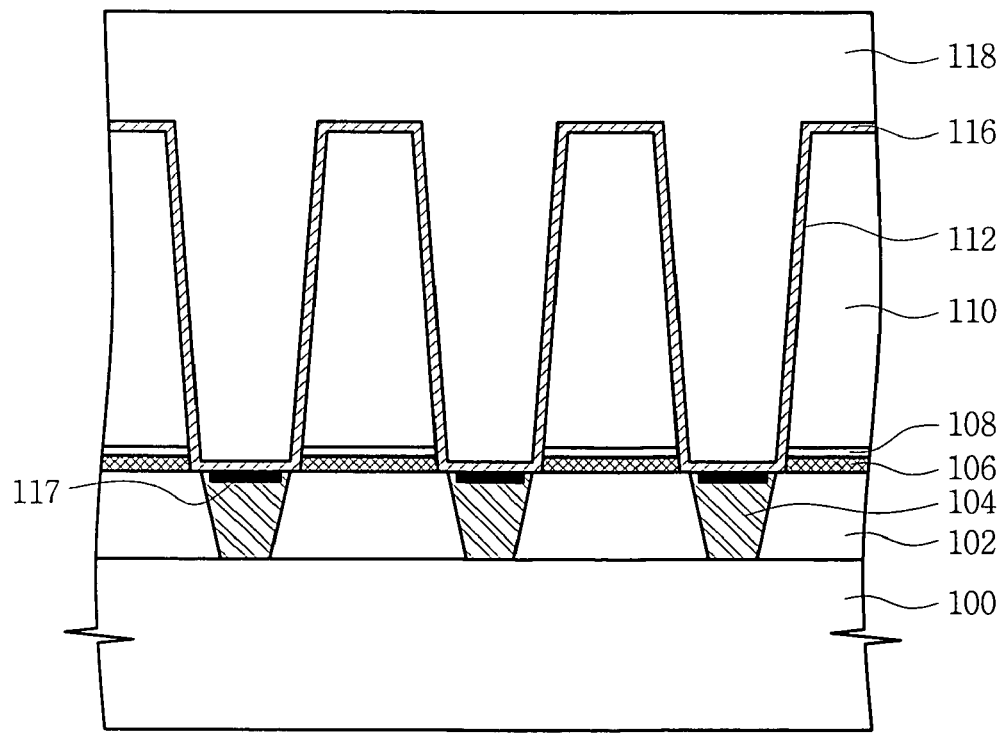
Figure 3:
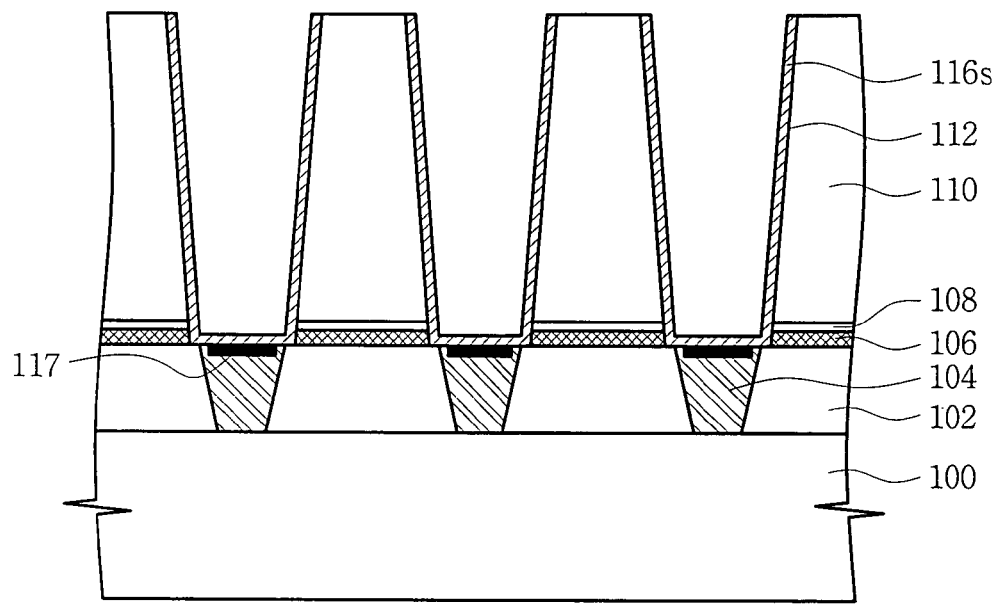
Figure 4:
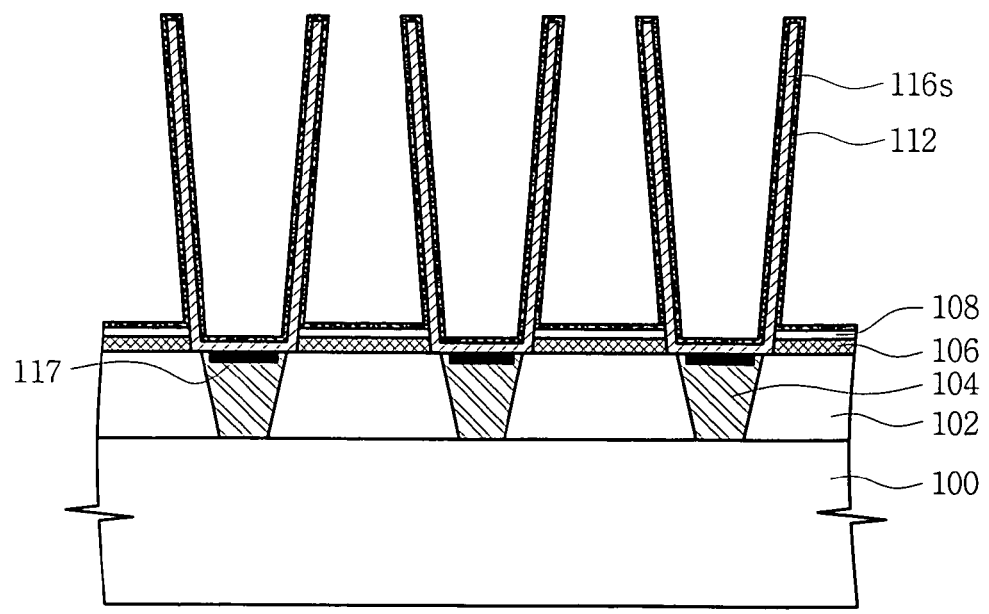
Figure 5:
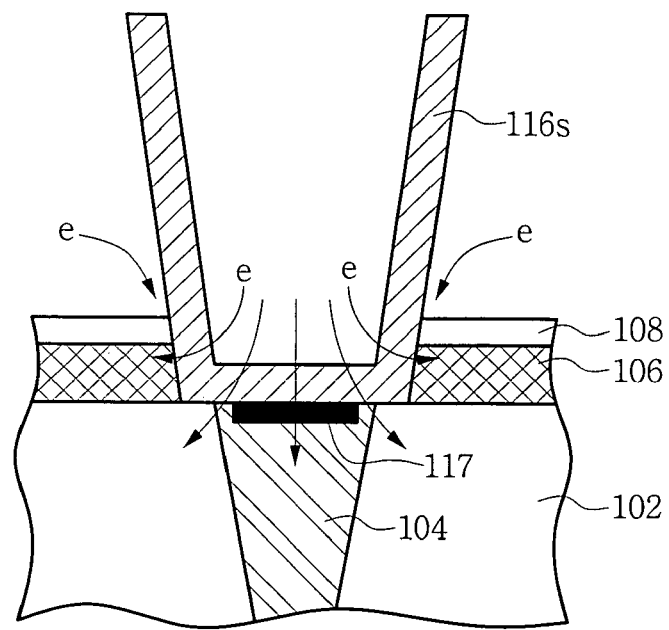
FIGS. 5 and 6 are cross-sectional views illustrating a problem generated in a conventional method of forming a storage electrode of a capacitor.
Figure 6:
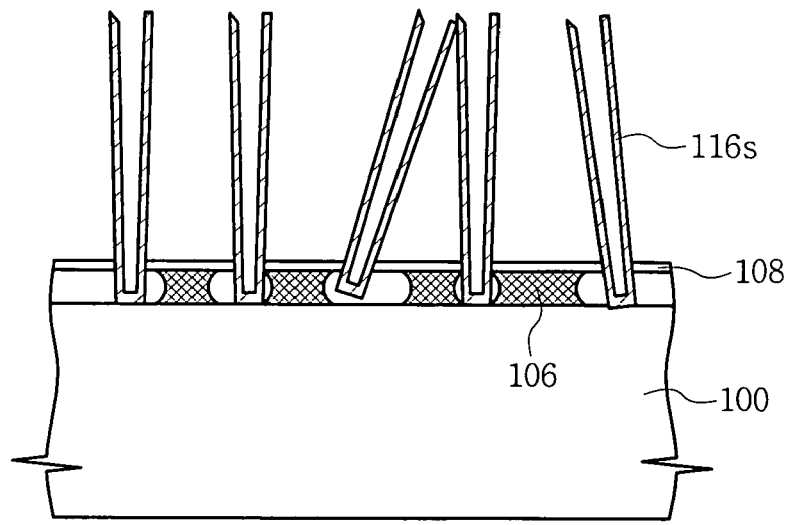
Figure 7:
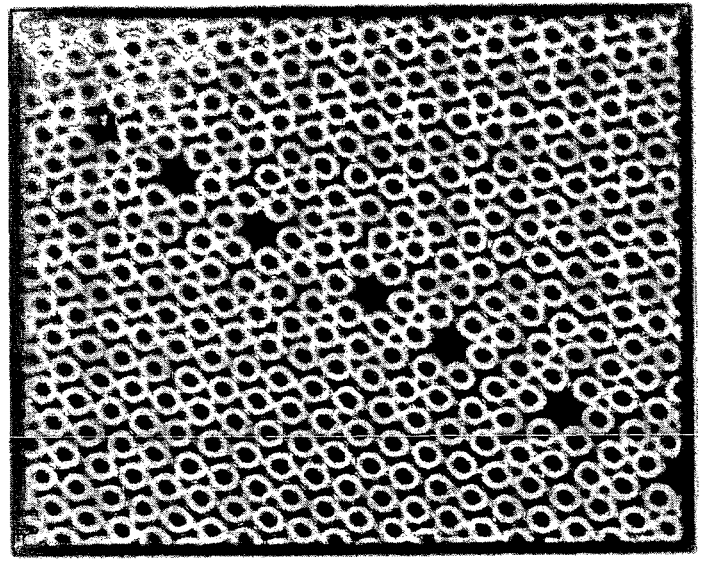
FIG. 7 is a photograph illustrating a leaning hole phenomenon caused by inclined storage electrodes.
Figure 8:
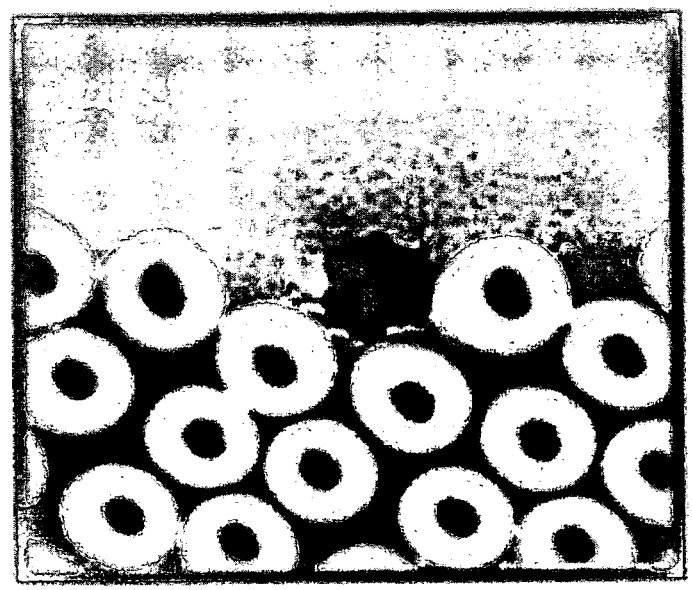
FIG. 8 is a photograph illustrating cavities generated in a lower mold layer due to a snail defect phenomenon.

The present invention will now be described with reference to the accompanying drawings, in which preferred embodiments of the invention are shown. However, the invention should not be construed as limited to only the embodiments set forth herein. Rather, these embodiments are presented as teaching examples. In the drawings, like numbers refer to like elements.

Figure 9:
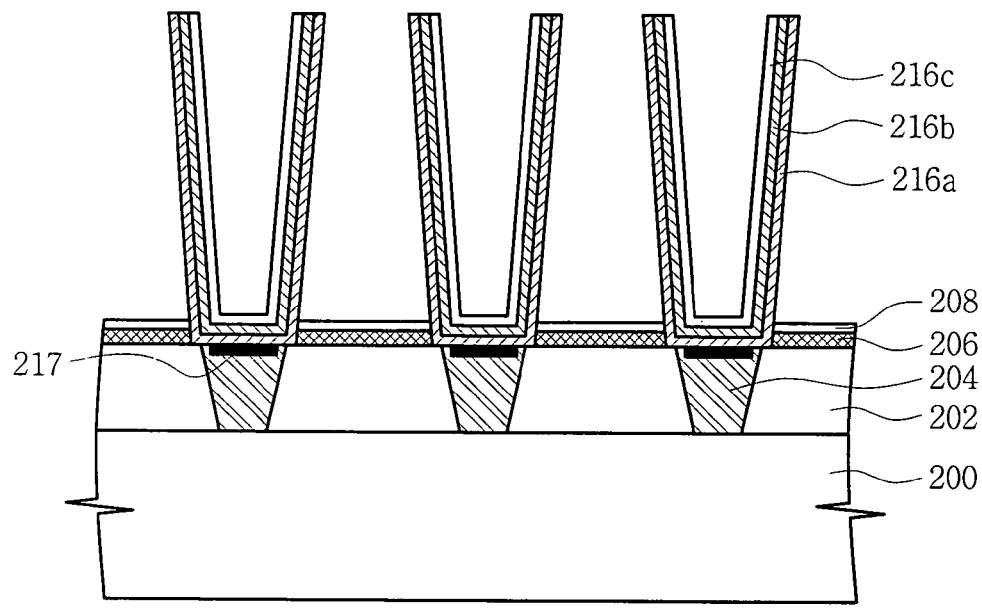
FIG. 9 is a cross-sectional view illustrating a structure of a storage electrode of a capacitor according to the present invention.

FIG. 9 is a cross-sectional view illustrating a structure of a storage electrode of a capacitor according to an embodiment of the present invention.

Referring to FIG. 9, the storage electrode of the capacitor according to an embodiment of the present invention includes a first metal layer 216a being in contact with a source region (not shown) of a transistor through a contact plug 204 penetrating an insulating layer 202 of a semiconductor substrate 200, and preferably formed as a concave shape inside a predetermined storage electrode region defined on the insulating layer. A silicon layer 216b is formed on the first metal layer 216a with a predetermined thickness. The silicon layer 216b may be changed from an amorphous structure to a crystal structure by a subsequent annealing process. And a second metal layer 216c formed on the silicon layer 216b to a predetermined thickness.

FIGS. 10a to 10e are cross-sectional views illustrating a method of forming the storage electrode of the capacitor of FIG. 9, according to an embodiment of the present invention.

Figure 10A:
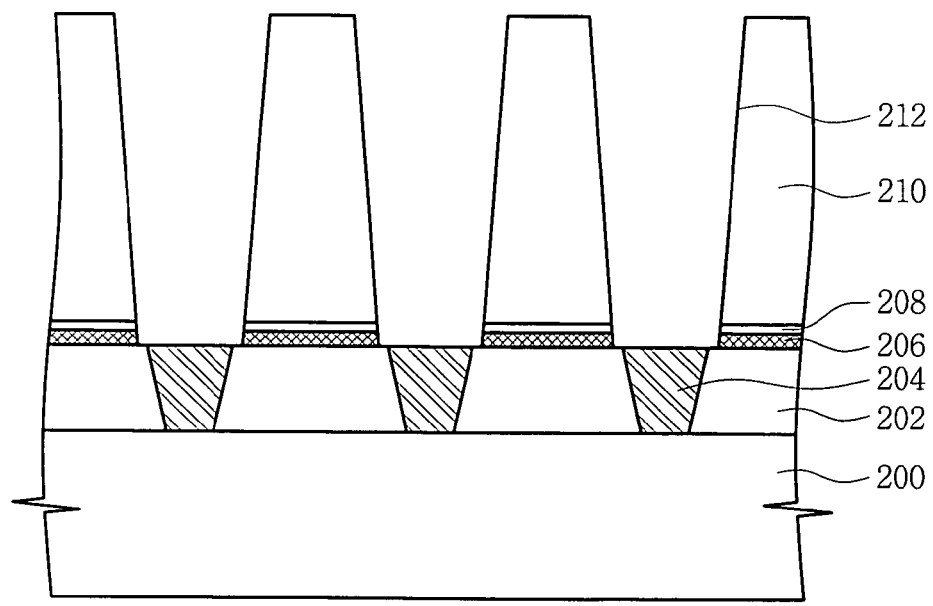
FIGS. 10a to 10e are cross-sectional views illustrating processes of a method of forming the storage electrode of the capacitor of FIG. 9 according to an embodiment of the present invention.

Referring to FIG. 10a, the insulating layer 202 is formed on the semiconductor substrate 200 having an isolation layer (not shown) and a transistor (not shown) formed thereon. Then, the contact plug 204, being in contact with the source region (not shown) of the transistor, is formed to penetrate the insulating layer 202. Then, a lower mold layer 206, an etch stop layer 208, and an upper mold layer 210 are formed on the surface of the resultant structure that includes the contact plug 204. The upper mold layer 210 may be formed of a silicon oxide layer, and may be formed of a material layer having a high etch rate in an oxide layer etch recipe, such as for a P-TEOS or an SOG group. Then, the upper mold layer 210, the etch stop layer 208, and the lower mold layer 206 are sequentially patterned, thereby forming a storage electrode hole 212, exposing the contact plug 204.

Figure 10B:
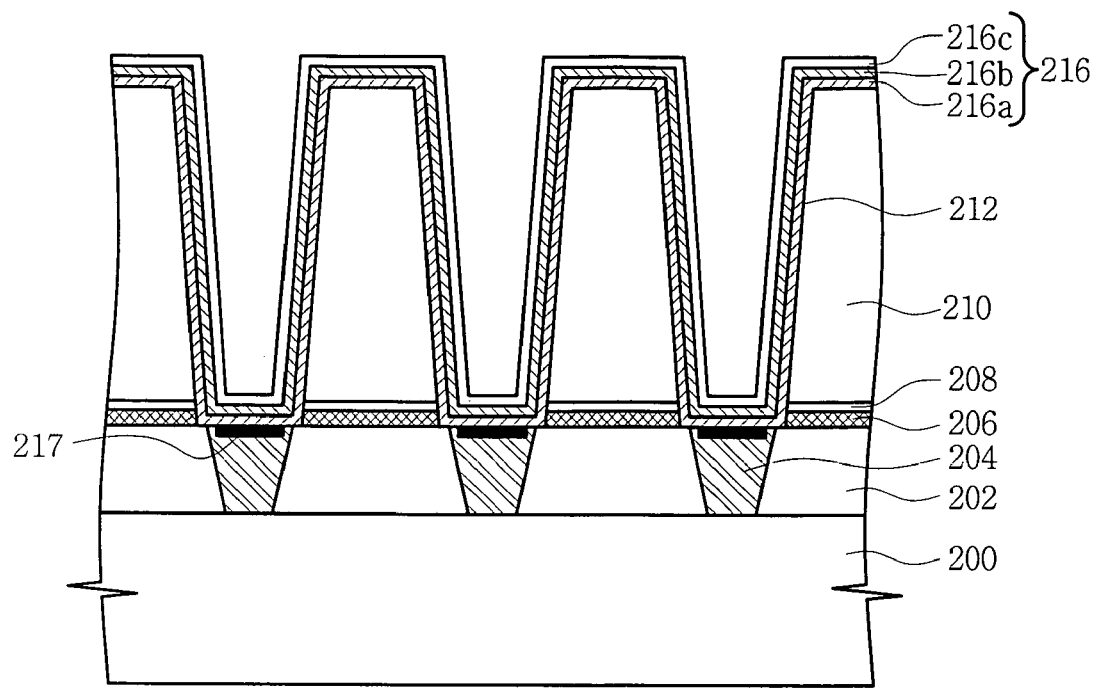

Referring to FIG. 10b, a storage electrode layer 216 is formed on the surface of the resultant structure including the storage electrode hole 212.

A thin $TiSi_x$ layer (for example, a $TiSi_2$ layer) 217 may be formed between the storage electrode layer 216 and the contact plug 204 during the formation of the storage electrode layer 216.

Then, titanium nitride (Ti/TiN) 216a, or other similar material, is deposited on the thin titanium silicon layer to form the storage electrode layer 216. A silicon layer 216b is deposited on the titanium nitride (Ti/TiN) 216a. Since the silicon layer 216b may be deposited at a low temperature of perhaps about 530° C. or less, it may be deposited as an amorphous structure. The silicon layer 216b may be formed by flowing silane ($SiH_4$) gas inside a chamber, and thermally decomposing the silane ($SiH_4$) gas. The silicon layer 216b is preferably formed to a thickness of about 100 Å or less. A titanium nitride (TiN) layer 216c, or other similar material, is deposited on the silicon layer 216b. At this time, a total thickness of the titanium nitride layers deposited above and below the silicon layer 216b is preferably less than about 350 Å. This is because if the total thickness of the titanium nitride layers is about 400 Å or more, a problem with cracking may occur.

Figure 10C:
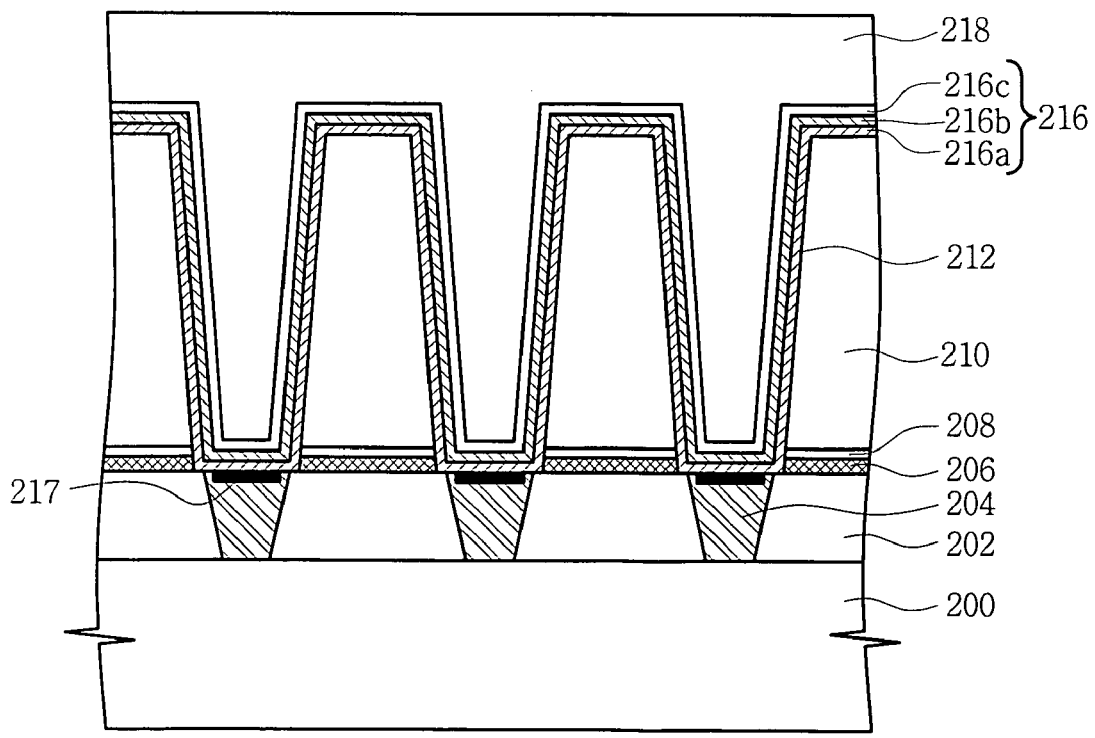

Referring to FIG. 10c, a sacrificial oxide layer 218 is formed on the storage electrode layer 216 to fill the storage electrode hole 212.

Figure 10D:
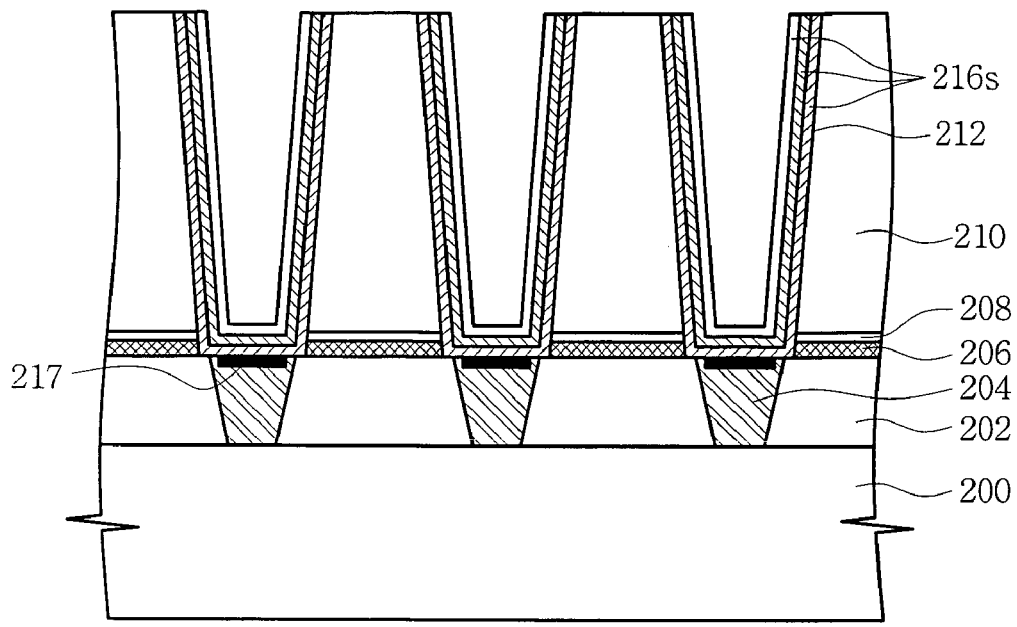

Referring to FIG. 10d, after the sacrificial oxide layer 218 is formed, a node separation process for the storage electrode is performed. First, the sacrificial oxide layer 218 and the storage electrode layer 216 are planarized and etched until the upper mold layer 210 is exposed, thereby separating a storage electrode 216s into a cell unit.

Then, the remaining sacrificial oxide layer 218 that is inside the cylinder structure of the storage electrode 216s is removed using a wet etch process, thereby exposing the inner wall of the storage electrode 216s. The etch solution for the wet etch process preferably uses an LAL solution.

The silicon layer 216b functions as an etch stop layer with respect to an etch solution. Thus, it can prevent the etch solution from penetrating into a grain boundary of the storage electrode 216s, and avoid etching the $TiSi_x$ layer 217. Further, it can prevent the etch solution from penetrating into the lower mold layer 206 that is below the etch stop layer 208, through the interface between the storage electrode 216s and the etch stop layer 208, and avoid etching the lower mold layer 206.

Also, it prevents a snail defect phenomenon caused by the etch solution penetrating into the storage electrode 216s, as well as a galvanic reaction occurring between the storage electrode 216s and the contact plug 204. Also prevented is the etch solution penetrating into the storage electrode 216s and etching the insulating layer 202.

Figure 10E:
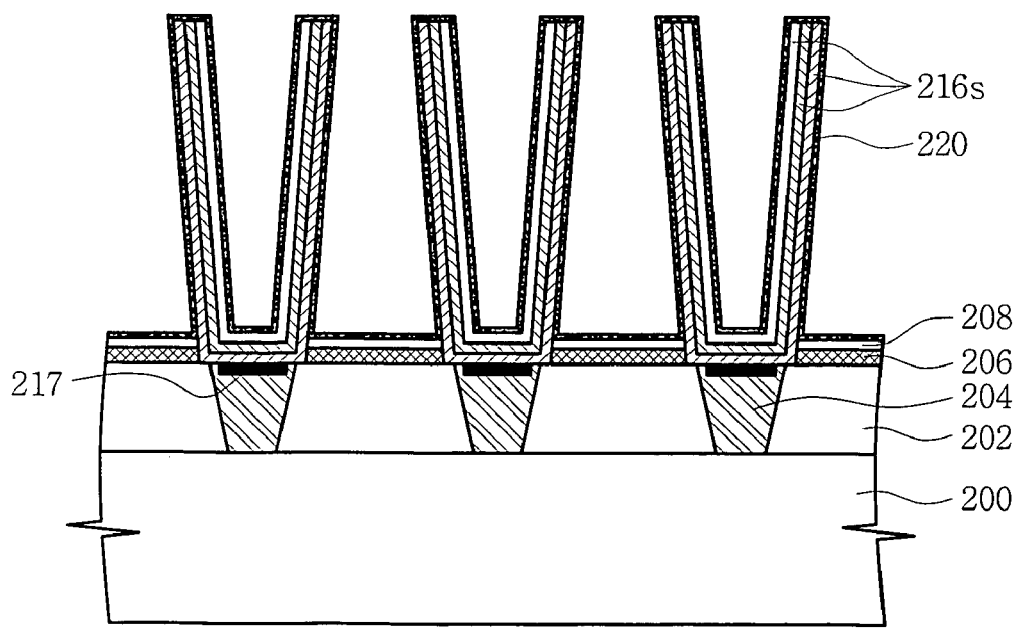

Referring to FIG. 10e, the upper mold layer 210 is isotropically etched, thereby exposing the etch stop layer 208, and concurrently exposing the outer wall of the storage electrode 216s.

Then the storage electrode 216s is annealed at a temperature of about 550° C. to about 600° C., to crystallize the amorphous structure of the silicon layer 216b.

Crystallizing the silicon layer 216b is intended to make the polysilicon layer function as an electrode.

Then a capacitor dielectric layer 220 is conformally formed on the surface of the resultant structure in which the outer wall of the storage electrode 216s is exposed, and subsequent capacitor formation processes are performed.

As described above, according to an embodiment of the present invention, an etch solution is prevented from penetrating into a grain boundary of a storage electrode to avoid etching a $TiSi_x$ layer. Further, the etch solution is prevented from penetrating into a lower mold layer that is below an etch stop layer, through the interface between the storage electrode 216s and the etch stop layer 208 to avoid etching the lower mold layer 206.

Also, a snail defect phenomenon is avoided, as well as a galvanic reaction occurring between the storage electrode and a contact plug. Also prevented is the etch solution penetrating into the storage electrode 216s and etching the insulating layer 202. Also, an etch solution is prevented from penetrating into the storage electrode to etch the insulating layer. Therefore, storage electrodes are prevented from falling, excessive etch of the lower mold layer is prevented, and a bridge occurring between the storage electrodes can be prevented.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation to encompass all such modifications and similar arrangements.

What is claimed is:

1. A method of forming a semiconductor device including a capacitor comprising:

patterning a mold layer formed on an insulating layer on a semiconductor substrate, thereby forming a storage electrode hole exposing an upper portion of a contact plug that penetrates the insulating layer;

forming a first metal layer over the resulting structure including the storage electrode hole;

forming an amorphous silicon layer on the first metal layer;

forming a second metal layer on the amorphous silicon layer, thereby forming a storage electrode layer; and annealing the storage electrode layer to crystallize the amorphous silicon layer.

2. The method according to claim 1, wherein the mold layer is formed by sequentially forming a lower mold layer, an etch stop layer, and an upper mold layer on the insulating layer that includes the contact plug.

3. The method according to claim 1, further comprising, after forming the storage electrode layer and before the wet etch process:

forming a sacrificial oxide layer on the storage electrode layer; and planarizing and etching the sacrificial oxide layer and the storage electrode layer until the mold layer is exposed.

4. The method according to claim 3, wherein, after the planarizing and etching, the remaining sacrificial oxide layer is removed using a wet etch process.

5. A method of forming a semiconductor device including a storage electrode of a capacitor comprising:

forming a contact plug penetrating an insulating layer on a semiconductor substrate;

sequentially forming a lower mold layer, an etch stop layer, and an upper mold layer on the insulating layer including the contact plug;

sequentially patterning the upper mold layer, the etch stop layer, and the lower mold layer, thereby forming a storage electrode hole that exposes an upper portion of the contact plug; sequentially forming a first metal layer, an amorphous silicon layer, and a second metal layer on the resulting structure including the storage electrode hole, thereby forming a storage electrode layer;

forming a sacrificial layer on the storage electrode layer;

planarizing the sacrificial layer and the storage electrode layer until the upper mold layer is exposed;

removing the sacrificial oxide layer remaining after the planarizing;

isotropically etching the upper mold layer, thereby exposing the etch stop layer and concurrently, exposing an outer wall of the storage electrode layer to form a storage electrode; and annealing the storage electrode to crystallize the amorphous silicon layer.

6. The method according to claim 5, wherein the storage electrode has a concave shape.

7. The method according to claim 5, wherein the amorphous silicon layer is deposited at a temperature of about 530° C. or less.

8. The method according to claim 5, wherein the amorphous silicon layer is formed by thermally decomposing silane ($SiH_4$) gas.

9. The method according to claim 5, wherein the sacrificial layer is removed by a wet etch process, using an LAL etch solution.

10. The method according to claim 5, wherein the annealing of the storage electrode to crystallize the amorphous silicon layer is performed at a temperature of about 550° C. to about 600° C.

11. The method according to claim 5, wherein the storage electrode sequentially includes a first titanium nitride layer, a polysilicon layer, and a second titanium nitride layer.

12. A method of forming a semiconductor device including a capacitor comprising:

patterning a mold layer formed on an insulating layer on a semiconductor substrate, thereby forming a storage electrode hole extending through the mold layer;

forming a first metal layer over the resulting structure including the storage electrode hole;

forming a silicon layer on the first metal layer; and forming a second metal layer on the silicon layer, thereby forming a storage electrode layer, wherein forming the silicon layer comprises depositing an amorphous silicon layer at a temperature of about 530° C. or less and annealing the resulting structure at a temperature of about 550° C. to about 600° C.

13. The method according to claim 12, wherein the first metal layer comprises titanium nitride.

14. The method according to claim 12, wherein forming the second metal layer comprises forming the second metal layer directly on the silicon layer.

15. The method according to claim 14, wherein forming the silicon layer comprises forming the silicon layer directly on the first metal layer.

* * * * *